US006329605B1

(12) United States Patent
Beroz et al.

(10) Patent No.: US 6,329,605 B1
(45) Date of Patent: Dec. 11, 2001

(54) COMPONENTS WITH CONDUCTIVE SOLDER MASK LAYERS

(75) Inventors: Masud Beroz, Livermore; Belgacem Haba, Cupertino, both of CA (US)

(73) Assignee: Tessera, Inc., San Jose, CA (US)

(*) Notice: Subject to any disclaimer, the term of this patent is extended or adjusted under 35 U.S.C. 154(b) by 0 days.

(21) Appl. No.: 09/277,677

(22) Filed: Mar. 26, 1999

Related U.S. Application Data
(60) Provisional application No. 60/079,463, filed on Mar. 26, 1998.

(51) Int. Cl.$^7$ .............................. H05K 1/03; H05K 1/16
(52) U.S. Cl. .................. 174/256; 174/260; 174/261; 174/255; 174/258; 361/768; 361/794
(58) Field of Search ...................... 174/260, 261, 174/250, 262, 266, 256, 257, 258; 361/748, 767, 768, 771, 779, 780, 794

(56) References Cited

U.S. PATENT DOCUMENTS

| | | | |
|---|---|---|---|
| 3,360,852 | * | 1/1968 | Cochran . |
| 3,530,229 | * | 9/1970 | Burke, Jr. . |
| 4,616,292 | * | 10/1986 | Sengoku et al. . |
| 4,884,170 | * | 11/1989 | Ohki et al. . |
| 5,133,495 | * | 7/1992 | Angulas et al. . |
| 5,148,265 | * | 9/1992 | Khandros et al. . |
| 5,148,266 | * | 9/1992 | Khandros et al. . |
| 5,400,220 | * | 3/1995 | Swamy . |
| 5,519,580 | | 5/1996 | Natarajan et al. ............. 361/760 |
| 5,585,162 | * | 12/1996 | Schueller . |
| 5,590,460 | * | 1/1997 | DiStefano et al. . |
| 5,766,987 | * | 6/1998 | Mitchell et al. . |
| 5,801,446 | * | 9/1998 | DiStefano et al. . |
| 5,818,697 | * | 10/1998 | Armezzani et al. . |

FOREIGN PATENT DOCUMENTS

WO 95/34106  12/1995  (WO) .
WO 97/44859  11/1997  (WO) .

OTHER PUBLICATIONS

Andros and Hammer, "TBGA Package Technology" IEEE Transactions on Components, Packaging and Manufacturing Technology, Part B, vol. 17, No. 4, VP 564–568.
Lau, John H., Ball Grid Array Technology, pp. 460–464.
Publication, in American National Standard ANSI/IPC–D–249, "Design Standard for Flexible Single and Double Sided Printed Boards," Jan. 1997, p. 47.
American National Standard ANSI/IPCD–275 of Sep. 1991 entitled Design Standard for Rigid Printed Boards and Rigid Printed Board Assemblies, pp. 62–68.
Design Guidelines for Surface Mount and Fine—Pitch Technology, 2nd edition, 1996 by Vernon Solberg, pp. 142–143.
Fjelstad, An Engineer's Guide to Flexible Circuit Technology (ElectroChemical Publications Limited 1997; ISBN 0901150347), pp. 148–149.
Standard ANSI/IPC–D–350, Revision D, Jul. 1992.
IBM Technical Disclosure Bulletin, vol. 40, No. 6, pp. 199–200 entitled "Ball Grid Array Solder Ball on Ball Grid Array Dimple Pad" (Jun. 1997).

* cited by examiner

Primary Examiner—Kamand Cuneo
(74) Attorney, Agent, or Firm—Lerner, David, Littenberg, Krumholz & Mentlik, LLP

(57) ABSTRACT

A component for forming solder connections includes a diectric base having a non solder-wettable surface, a plurality of solder-wettable pads exposed to said surface, and an electrically conductive potential plane element having a non solder-wettable surface overlying the surface of the base in proximity to the pads but spaced from said pads. The non-wettable surface of the potential plane element may include a metal such as nickel or a metal oxide. The potential plane element thus performs the functions of a solder mask to prevent solder from forming short circuits between adjacent pads, and may also act as a ground plane, power plane or shielding element.

11 Claims, 3 Drawing Sheets

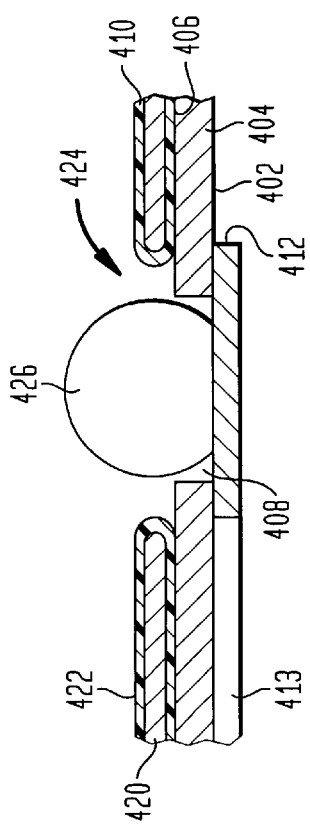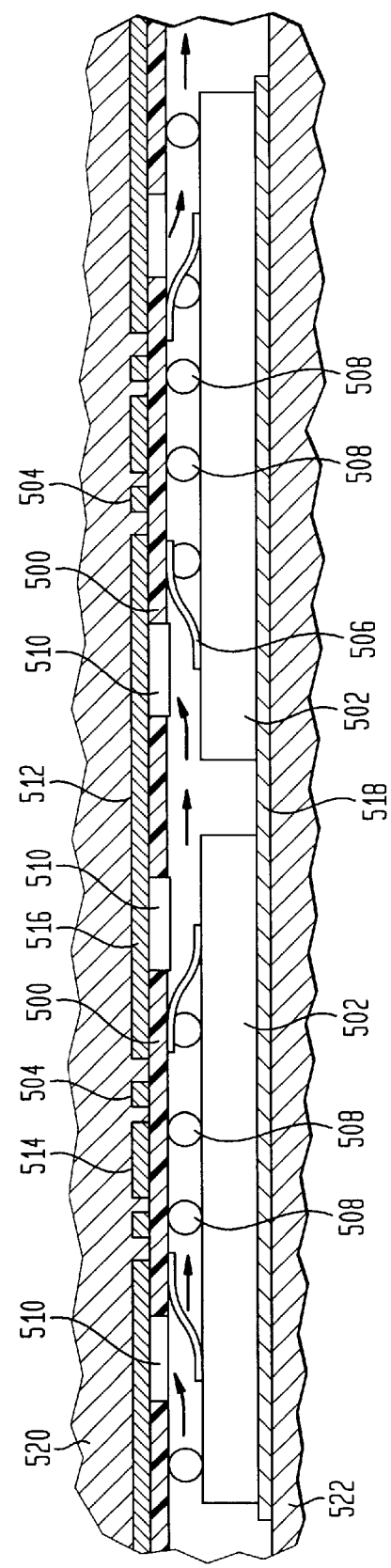

COMPONENTS WITH CONDUCTIVE SOLDER MASK LAYERS

The present invention claims the benefit of the U.S. Provisional Application No. 60/079,463 filed on Mar. 26, 1998, the disclosure of which is incorporated by reference herein.

BACKGROUND OF THE INVENTION

FIELD OF THE INVENTION

The present invention relates to microelectronic connection components and more specifically relates to microelectronic assemblies incorporating soldered connections and to components incorporating pads for soldering.

Soldered connections are used throughout the electronics industry to connect electronic components. Where the components to be connected include dielectric elements such as a rigid circuit panel or a flexible dielectric circuit panel with conductive metallic traces, the traces may be provided with enlarged regions, commonly referred to as "lands" or "pads". The traces may extend along a surface of the dielectric element. A further dielectric element, commonly referred to as a "solder mask" or "coverlay" may be provided. The solder mask layer may be applied by laminating a preformed dielectric sheet to the surface of the dielectric element, or by forming the dielectric sheet from a curable liquid on the surface of the dielectric element. The solder mask has holes at spacings corresponding to the spacings of the pads. The solder mask coverlay closely overlies the trace-bearing surface of the panel and closely overlies the metallic traces, leaving all or part of each pad exposed at the corresponding hole in the solder mask. A mass of solder may be deposited on each pad, either by exposing the assembly to a liquid solder, as in a wave soldering or dip soldering process or, more typically, by applying solder performs commonly referred to as "solder balls" onto the pads and heating the assembly to melt the solder. The molten solder wets the metal of the pads and forms a strong bond to the pads. The solder mask layer, which is not wettable by the solder confines the solder on the pads. In the absence of the solder mask layer, the molten solder could wet the metal in the traces extending away from the pads and hence could flow outwardly, along the traces. This would provide solder in undesired locations and displace the solder mass from its desired location, centered on the pad. Moreover the undesired solder flow can remove solder from the pads where it is required for forming the joints. The solder mask prevents this undesired flow.

After application of the solder masses, the component has solder masses protruding from the surface. A component such as a semiconductor chip package having an array of solder masses on a surface in a grid-like pattern is sometimes referred to as a "ball-grid array" element. The use of ball-grid arrays in packages for microelectronic devices such as semiconductor chips is described for example, in the article "TBGA Package Technology," IEEE Transactions on Components, Packaging and Manufacturing Technology, Part B, Vol. 17, No. 4, VP 564–568 by Andros and Hammer and in "Ball Grid Array Technology," Lau, J. H. ed, pp. 460–464. As described, for example, in commonly assigned U.S. Pat. Nos. 5,148,265 and 5,148,266, the disclosures of which are hereby incorporated by reference herein, a microelectronic component such as a semiconductor chip may include a set of pads in the form of terminals which may be mounted on a dielectric layer such as a flexible sheet. The pads or terminals may be connected to contacts on the chip by flexible leads and may be supported above the surface of the chip by a compliant layer such as an elastomer interposed between the terminals and the chip, typically between the dielectric layer and the chip. Masses of solder may be provided on the pads or terminals for connecting the assembly to a circuit board or other substrate having corresponding pads.

The component can be engaged with another component having a corresponding set of pads and, typically, also having similar solder mask. After engaging the protruding solder masses with the pads of the other component, the solder masses may be heated again to melt all or part of each solder mask and bond the solder masses to the pads of the other component. The resulting solder columns interconnect pads on both components with one another electronically and also form a mechanical connection between the components. In a variant of this process, each solder ball may include a core, typically formed from a conductive metal such as copper or nickel which does not melt at the temperatures used to melt the solder. Such a core is commonly referred to as a "solid core". A "solid" core in this context may have one or more interior voids, or else may be entirely free of voids. The resulting solder joint includes the solid core embedded within an outer layer of solder. Alternatively, the protruding solder elements may be engaged with a small socket having holes and metallic resilient elements designed to accept and engage the solder elements in the holes. Sockets of this type are disclosed in certain embodiments of International Patent Publication WO 95/34106. Other sockets which can engage protruding solder or other elements are described in International Patent Publication WO 97/44859. The disclosures of said International Patent Publications are hereby incorporated by reference herein One particularly useful approach described in commonly assigned in U.S. patent application No. 411,472 filed Mar. 28, 1995, now U.S. Pat. No. 5,801,446, the disclosure of which is hereby incorporated by reference herein, incorporates solid core solder assemblies in components with having pads supported on a compliant layer. In certain structures according to the '446 patent, the compliant layer allows the pads and hence the solid core solder assemblies to move when the component with the assemblies thereon is juxtaposed with another component. This allows the solid core solder assemblies to engage the pads on the opposite component despite some minor deviations from perfect planarity of the pads on the components. Moreover, the compliant layer in the assembly mechanically decouples the pads from movement of the underlying component caused by thermal expansion and contraction and thus reduces the mechanical stresses, such as fatigue on the solder assemblies. The mechanical decoupling also facilitates use of the component with a socket adapted to receive the solid core solder balls.

Some typical configurations for pads or lands are described for example in American National Standard ANSI/IPC-D-249, Design Standard for Flexible Single and Double Sided Printed Boards; in American National Standard ANSI/IPCD-275 of September 1991 entitled Design Standard for Rigid Printed Boards and Rigid Printed Board Assemblies, pp.62–68; in Design Guidelines for Surface Mount and Fine—Pitch Technology, 2nd edition, 1996 by Vernon Solberg, pp.142–143; and in Fjelstad, An Engineer's Guide to Flexible Circuit Technology (ElectroChemical Publications Limited 1997; ISBN 0901150347), pp.148–149.

Many common pads are round, circular bodies of conductive material. However, other shapes, such as hollow circles or squares of conductive material have been employed. Also, round and square lands with branches or ribs extending from them have been employed as illustrated in Standard ANSI/IPC-D-350, Revision D, July 1992 and in Natarajan et al., U.S. Pat. No. 5,519,580. Still other solder land configurations are disclosed in IBM Technical Disclosure Bulletin, Vol. 40, No. 6, pp.199–200 entitled "Ball Grid Array Solder Ball on Ball Grid Array Dimple Pad" (June 1997); in U.S. Pat. No. 5,400,220 and in U.S. Pat. No. 5,133,495.

Despite all of these efforts in the art however, further needs for improvement in microelectronic assemblies incorporating solder joints, and in methods and components for making such joints, remain.

SUMMARY OF THE INVENTION

One aspect of the invention provides for making soldered assemblies components. A component according to this aspect of the invention includes a base having a non solder-wettable surface such as a dielectric surface. A plurality of pads which are wholly or partially solder-wettable are exposed to such surface of the base. That is, the pads may be disposed on the surface, or may be recessed beneath the surface but aligned with apertures in the surface so that the pads are accessible from above such surface. A non solder-wettable electrically conductive potential plane element overlies the surface in proximity to the pads but spaced from the pads so that there is a gap between each pad and potential plane element. The potential plane element desirably has openings extending through it, and the pads are exposed through the openings. For example, the potential plane element may have holes in it, the holes being larger than the pads. The pads may be aligned with the holes so that there is an annular gap between each pad and the periphery of the hole in the potential plane element.

The potential plane element according to this aspect of the invention preferably includes a metallic layer. The potential plane element may have an exposed surface, with a non solder-wettable metal or metal compound formed integrally with the metallic layer, or else may have a dielectric material such as a polymer deposited on the metal layer to provide the non solder-wettable surface. In a method of fabricating solder assemblies, a component as aforesaid may be provided with masses of molten solder on the pads so that molten solder on each pad wets the pad. The solder and pads may be cooled to solidify the solder. The resulting subassembly has solder masses projecting from the pads through the holes in the potential plane. In such a process, some or all of the masses of molten solder may initially contact the potential plane element while in the molten state, but these will retract away from the potential plane element before the solidification step under the influence of surface tension of the molten solder. The components and methods according to the last-said aspect of the invention avoid the need for a separate dielectric solder mask when processing an assembly which also includes a metal potential plane element. The metallic potential plane element which serves as a solder mask can also serve as a ground or power distribution conductor; as a shield against electromagnetic interference and as reference element in strip-mine circuits formed by electrical conductors extending in proximity to the potential plane element. Such a strip-mine circuit provides controlled impedance connections.

Moreover, the metallic layer greatly enhances the dimensional stability of the potential plane or solder mask, and hence facilitates registration of holes in the potential plane or solder mask with terminals on a base. In a lamination process according to a further aspect of the invention, a solder mask layer incorporating a metallic layer, having holes at preselected locations and having a non solder-wettable surface on at least one side of the metallic layer is juxtaposed with a surface of a dielectric base having a non solder-wettable surface and a plurality of solder-wettable pads at preselected locations on said surface so that a non solder-wettable surface of the solder mask layer faces away from the base and so that the holes in the solder mask are aligned with the pads on the base. The solder mask layer is laminated to the base. Such a process can be used to fabricate components as discussed above.

BRIEF DESCRIPTION OF THE DRAWINGS

FIG. 6 is a view similar to FIG. 5 but depicting a component according to a further embodiment of the invention.

FIG. 7 is a diagrammatic sectional view depicting additional components according to the invention.

DETAILED DESCRIPTION OF THE PREFERRED EMBODIMENTS

Figure 1:
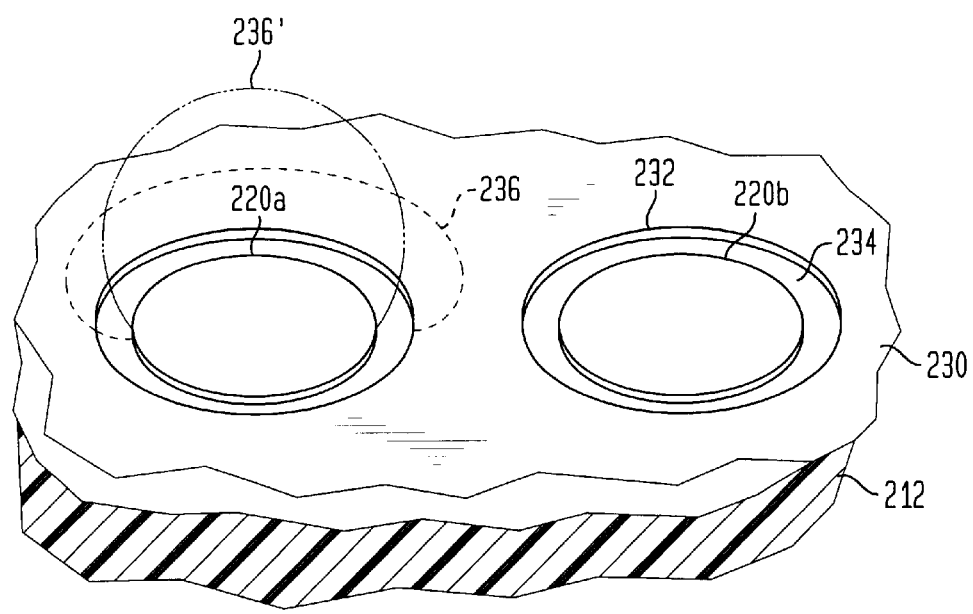
FIG. 1 is a fragmentary diagrammatic perspective view depicting a component in accordance with an embodiment of the invention, in conjunction with a solder mass.

A component according to one embodiment of the invention includes a base having a dielectric layer 212 and a plurality of electronically conductive pads 220a, 220b on an exposed surface of dielectric layer 212. The conductive pads are illustrated as uniform, entirely wettable circular features. However, the pad configuration with wettable and non-wettable areas as described in the copending, commonly assigned U.S. patent application of Thomas DiStefano entitled Solder Pads and Microelectronic Assemblies With Soldered Joints, Ser. No. 09/047,638 filed: Mar. 25, 1998, the disclosure of which is incorporated by reference herein, can also be employed. The component has a metallic potential plane element 230 overlying the dielectric layer 212. The potential plane element 230 has holes 232 extending through it. Each hole 232 is aligned with one pad 220a, 220b. Each hole is slightly larger than the pad disposed therein so that there is an annular gap 234 between the outer edge of each pad and the inner edge of layer 230. Thus, the particular pads illustrated are not in electrical contact with potential plane layer 230. The potential plane layer has a non-wettable surface at least in the regions surrounding holes 232 and pads 220a, 220b The potential plane element may be provided with the non-wettable surface by forming a non-wettable surface of a metal as, for example, one or more metals selected from the group consisting of nickel, chromium, rhodium, osmium, and combinations thereof. As used in this disclosure, reference to a combination of metals should be understood as including both alloys and mixtures of the metals, as well as layered structures including the plural metals overlying one another. Alternatively or additionally, the non-wettable surface may include a metal compound such as an oxide or nitride of a metal. In yet another alternative, the non-wettable surface may be provided by forming the potential plane element entirely from a non-wettable metal such as stainless steel. The foregoing methods form non-wettable surfaces integral with the metallic layer of the potential plane element. As used in this disclosure, a reference to a non-wettable surface which is integral with a metallic element should be taken as indicating that the non-wettable surface is unified with the underlying metallic element, as, for example, where the non-wettable surface is defined by the metal element itself; by a layer of metal connected to the underlying metallic element through one intimate metallurgical bond or through a series of such bonds involving one or more intermediate metallic layers, with all the interfaces between layers being intimate, metallurgical bonds. The term integral also includes layers of a metal compound which are compounds formed directly from the underlying metal or from one or more metal layers connected to the underlying metal by directly or by intermediate metallurgical bonds as discussed above.

Figure 2:
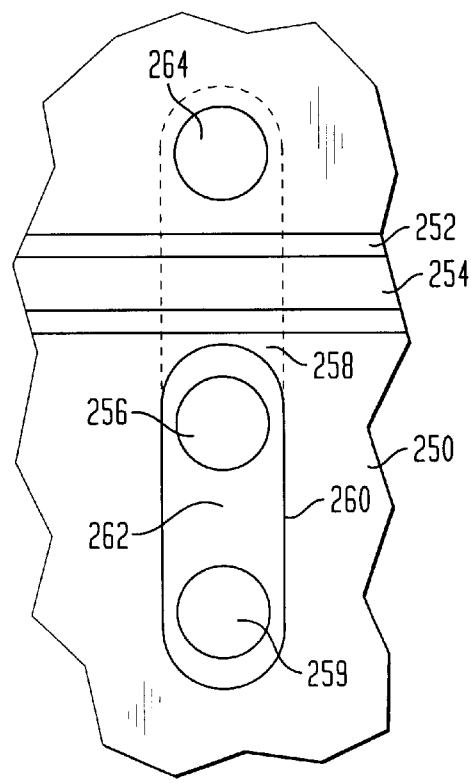
FIG. 2 is a fragmentary diagrammatic top plan view of a component in accordance with another embodiment of the invention.

In operation, when a mass of solder is deposited on a pad 220a and reflowed, the solder may tend to spread towards another pad 220b. For example, the solder may be momentarily displaced to a distorted condition indicated in broken lines at 236 in FIG. 1, in which the solder contacts the potential plane element. However, because the potential plane element has a non-wettable surface, surface tension will tend to restore the solder to the condition shown at 236' in FIG. 1, wherein the solder is out of contact with the potential plane element. The non-wettable surface of the potential plane lelement prevents the solder from flowing to the adjacent contact 220b and forming an unintended circuit or "bridge" between adjacent pads. The non-wettable surface need not be provided on the portions of the potential plane element remote from the solder pads, where solder will not be encountered during the use of component. Also, the non-wettable potential plane element can be used to provide isolation between features other than solder pads. For example, as shown in FIG. 2, the potential plane element 250 has an elongated slot 252. A conductive, solder-wettable trace such as a copper trace 254 extends in such slot. Trace 254 is isolated from solder on a conductive solder pad 256 by the non-wettable surface of the potential plane element in a region 258 disposed between the pad of 256 and the trace 254. Also, more than one pad may be positioned within a single gap. Thus, pads 256 and 259 are both disposed within a single, elongated hole 260 in the potential plane element 250. The underlying non-wettable surface of a dielectric body 262 exposed within a hole 260 can act to prevent solder bridging between these pads. The pads themselves may be provided with integral non-wettable regions to aid in confinement of the solder. The potential plane elements itself typically is provided with one or more solder-wettable pads electrically connected to the potential plane element. For example, a solder-wettable spot 264 is provided on the potential plane element itself to serve as a solder pad for connecting the potential plane element to a ground, power or other suitable constant potential source.

Figure 3:
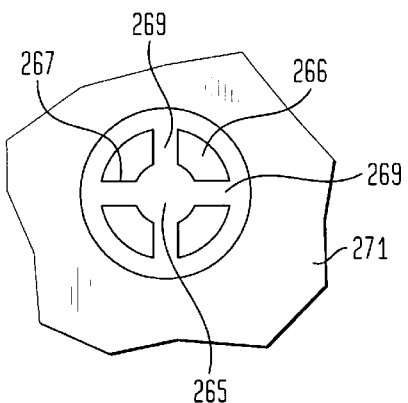
FIG. 3 is a fragmentary diagrammatic plan view of a component according to a further embodiment of the invention.

In a component according to a further embodiment, a solder-wettable spot 265 (FIG. 3) is provided as an isolated element in a hole 266 in the potential plane element 269 , the isolated element being connected by metallic bridges 267 to the remainder of the potential plane element. The majority of the exposed surface of the potential plane element has a non solder-wettable surface 271. The isolated element facilitates heating of the solder-wettable spot during application of the molten solder because heat conduction from the spot to the remainder of the layer is minimized. However, the isolated element construction maintains electrical continuity between the solder-wettable spot and the remainder of the potential plane element.

Figure 4:
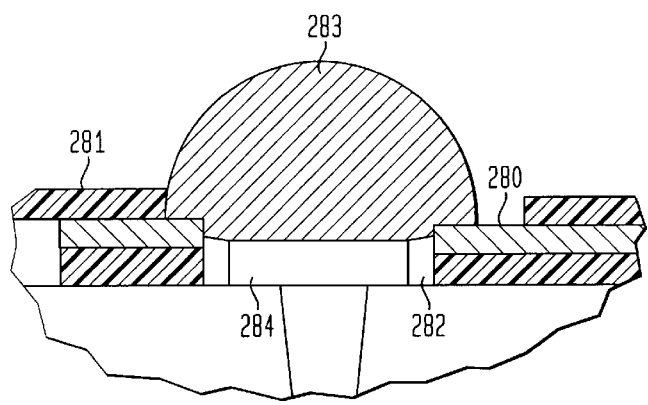
FIG. 4 is a fragmentary diagrammatic sectional view of a component according to yet another embodiment of the invention.

In a component according to yet another embodiment (FIG. 4), the solder-wettable regions on the exposed surface of the potential plane element include an edge region 280 of an exposed surface 281 of the solder immediately surrounding a hole 282 in the solder mask layer and a pad 284 on the base. The remaining regions of surface 281 include a non solder-wettable surface treatment or coating 285. This surface treatment or coating can include a polymeric coating as discussed below or else can include an integral metallic or metal compound layer as discussed above. A single mass of molten solder 283 is provided in contact with pad 284 and with edge region 280 at the same time as the other masses of molten solder are provided. Upon cooling, this single mass forms a solder bump connecting the pad to the potential plane element. When the assembly is bonded to a circuit board or other substrate, or engaged in a socket, the same solder bump may connect both the pad and the potential plane element to an external source of ground or power potential.

Figure 5:
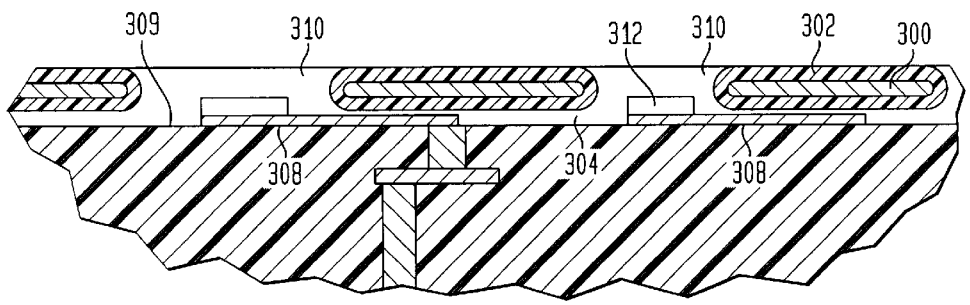
FIG. 5 is a fragmentary diagrammatic sectional view of a component according to a further embodiment of the invention.

In a further variant, the solder mask layer may include a metallic layer 300 (FIG. 5) covered by a non-integral dielectric coating 302 such as a polymeric or other coating deposited by an electrophoretic or other deposition process. For example, such a coating may be applied by an electrophoretic deposition process. In an electrophoretic deposition process, the metallic layer is connected to a source of electrical potential and immersed in a bath of a liquid deposition mixture along with a counter electrode. A potential applied between the counter electrode and the metallic layer causes solid material from the deposition mixture to deposit onto the surfaces of the pads. Electrophoretic deposition processes and materials for use in deposition mixtures are well known in the coating arts. For example, materials for applying an acrylic polymer are sold under the designation Powercron cationic acrylic (900—900 series) by the PPG Company. Materials for applying epoxy coating are sold under the designation Powercron cationic epoxy (400–600 series) by the same vendor. Typically, the counter electrode is larger than the area to be covered by the coating and the current density during the electrophoretic deposition step desirably is maintained below about 1 milliampere per centimeter of coated area so as to minimize formation of defects in the deposited coating. The current may be substantially constant during the process. The applied potential may be on the order of about 100 volts and typically is applied for a few minutes or more. After the electrophoretic deposition step, the part is removed from the deposition bath, washed to remove clinging undeposited solution and then baked to cure the coating to a solid form. Further methods of electrophoretic deposition are disclosed in copending, commonly assigned U.S. patent application Ser. No. 09/119,079 filed Jul. 10, 1998 the disclosure of which is hereby incorporated by reference herein. Processes for forming electrophoretically-coated metal layers with holes in the coating at preselected locations to provide electrical connection to the metal layers are disclosed in U.S. Pat. No. 5,590,460, the disclosure of which is hereby incorporated by reference herein. Such processes can be used to provide solder-wettable areas on the potential plane layers used herein.

Other processes for depositing a dielectric coating may be employed as, for example, dipping or spraying in a curable coating material such as an epoxy, urethane, lacquer or plastisol to form an adherent liquid film and then curing the film to form a solid dielectric coating on the surfaces of the pads. Here again, the pads desirably are masked so that only a portion of each pad is covered by the coating. Vapor deposition and plasma polymerization processes may also be employed. It is desirable to apply the coating in as close to a uniform thickness as is practicable.

An adhesive 304 may be provided to bond the solder mask layer to the top surface 309 of the dielectric base 306. Where the solder mask layer includes a dielectric coating such as a polymeric coating, the solder mask layer may be deposited directly over an exposed surface of the base even where the base surface includes exposed metallic traces 308. The dielectric layer of the solder mask layer will insulate the metallic element 300 from the traces. The dimensional stability provided by the metallic potential plane layer 300 greatly facilitates alignment of the holes 310 in the solder mask with the pads 312 on the base during the lamination process. This greatly alleviates the problem of misregistration between the pads and the holes. The problem of misregistration, and the solution afforded by this aspect of the invention, are especially significant where the pads are disposed at a relatively fine pitch, typically less than about 1 mm more preferably less than about 0.75 mm and most preferably about 0.5 mm or less. Fine-pitch components typically have been fabricated by applying a photosensitive polymeric masking composition to the entire surface of the base, and then photographically patterning such layer in registration with the pads to form the holes. Because of the improved control of hole placement achieved in preferred processes according to this aspect of the invention, a lamination procedure using a preformed solder mask layer can be used even with a fine-pitch component. Moreover, in an assembly process wherein a separately formed solder mask is placed on a pad-bearing base, the size of the hole in a solder mask required to avoid overlap of the solder mask with the pad is determined by the sum of the pad diameter and the amount of misregistration inherent in the assembly process. Because the metal layer reduces the amount of misregistration the holes in the solder mask layer in a process using the a solder mask with a metal layer can be smaller than the holes which would be required in a comparable process which does not employ a metal layer in the solder mask.

Although fabrication processes using a separately formed solder mask are preferred, other processes can also be used. For example, a conductive potential plane element with a non solder-wettable surface can be applied by plating a metal onto the base selectively to form the potential plane element of the solder mask, followed by formation of the non-wettable surface using any of the procedures discusses above. The use of a potential plane element with a non solder-wettable surface as a substitute for a conventional solder mask provides significant benefits regardless of the fabrication process. The potential plane element affords electromagnetic shielding to reduce the effects of interference and can also be used as a power or ground conductor and as a potential reference for so-called "striplines" or transmission lines constituted by signal traces running within the dielectric element and insulated from the potential plane by a layer of dielectric material. Also, the potential plane element can provide structural reinforcement to the component and can enhance the dimensional stability of the component during manufacture and during use. Further, the potential plane element can provide increased heat conductivity so as to facilitate cooling of the component and cooling of the devices attached thereto.

In yet another variant, a solder mask including the metallic or other conductive potential plane element may have a non solder-wettable surface on only one side. The solder mask is assembled to or formed on the base so that the non solder-wettable surface faces away from the base. The solder-wettable side is engaged with the base and hence will not be wet by the solder when the molten solder is applied to the pads.

The component illustrated in FIG. 6 has pads 412 disposed on a back surface 402 of a sheetlike dielectric base 404, so that the pads are recessed beneath the front surface 406 of the base. The pads are exposed to the front surface through apertures 408 in the base. A potential plane or solder mask 410 overlies the front surface. The potential plane includes a metallic core 420 and a surface layer 422 formed from a non solder wettable material as discussed above. The holes 424 in the potential plane are aligned with the apertures 408 in the base, so that pads 412 are exposed through holes 424 and through apertures 408. Here again, solder masses 426 may be provided on the pads, and will project through the potential plane layer. Structures according to this embodiment may incorporate the features discussed above. In the structure of FIG. 6, pads 412 and traces 413 are electrically isolated from the potential plane by the dielectric of base 404 itself. Therefore, the potential plane element may have an electrically conductive surface confronting the front surface 406 of the base. In other arrangements, where traces are provided on the front surface of the base, a separate dielectric layer (not shown) may be provided between a potential plane element having a conductive surface and the front surface of the base. Such a separate dielectric layer may have apertures aligned with the terminals.

As disclosed, for example, in certain embodiments of commonly assigned U.S. Pat. No. 5,766,987, the disclosure of which is hereby incorporated by reference herein, microelectronic assemblies having exposed terminals may be encapsulated in a process wherein a covering layer protects the terminals from the encapsulant. The potential plane layers used in the foregoing aspects of the invention may be serve as covering layers in such a process. For example, as shown in FIG. 7, a set of assemblies each including a dielectric component 500 and a semiconductor chip 502 are disposed in a side-by-side array. The dielectric components of the various assemblies may be provided as a unitary tape or film. The dielectric components have terminals 504 exposed to the front surfaces of the components, facing away from the chips. Leads 506 interconnect the terminals with chips 502. The dielectric components are supported above the chips by spaced-apart elastomeric elements 508 during fabrication of the assemblies. The dielectric components are provided with apertures, commonly referred to as "bond windows" 510. During fabrication of the assemblies, a bonding tool is advanced into bond windows 510 to bond the leads 506 to the chip.

After the leads have been bonded to the chip, a mask layer or potential plane element 512 similar to those discussed above is applied over the front surfaces of components 500. The mask layer has apertures 514 in registry with terminals 504, but has imperforate regions 516 in registry with bond windows 510. A further, bottom cover layer 518 may be applied over the rear surfaces of chips 502. While the assemblies and layers 512 and 518 are held between fixtures 520 and 522, an flowable encapsulant such as a liquid composition adapted to form a gel or elastomer is injected around and into the assemblies. The encapsulant penetrates into spaces between elastomeric elements 508. The encapsulant is cured to form a compliant dielectric layer between each component 500 and the associated chip 502. During the encapsulant injection process, the potential plane element prevents flow of the encapsulant through the bond windows 510 and thereby protects terminals 504 from the encapsulant. Stated another way, the potential plane element or solder mask 512 blocks flow of the encapsulant onto the terminals. After curing of the encapsulant, the assemblies are separated from one another by severing the continuous tape forming components 500, and by severing the cured encapsulant between the chips. In this process, the same potential plane element or solder mask layer 512 which performs multiple functions in the finished product also performs the additional function of protecting the terminals during the encapsulation process.

In a variant of this process, the components 512 may be provided as separate elements with spaces between the components. The solder mask layer covers these spaces and blocks flow of the encapsulant onto a the terminals. In a further variant, layer 512 is provided as a temporary structure, which is removed after encapsulant curing. In this embodiment, the layer does not act as a potential plane layer in the finished product. However, the use of a metallic layer still provides benefits in such a process. The metal layer may be provided with an electrophoretically deposited adhesive coating. Such a structure can be made economically. Also, the metal layer for use in such a process need not incorporate holes in registry with the terminals. The rear covering layer 518 may be a similar metal-based layer.

As numerous variations and combinations of the features discussed above can be utilized without departing from the present invention, the foregoing description of the preferred embodiment should be taken by way of illustration rather than by way of limitation of the invention as defined by the claims.

What is claimed is:

1. A component for forming solder connections comprising a dielectric base having a non solder-wettable surface, a plurality of solder-wettable electrically conductive pads exposed to said non solder-wettable surface, and an electrically conductive potential plane element having a non solder-wettable surface overlying said non solder-wettable surface of said base, said potential plane element having a plurality of openings therein, said at least some of said plurality of pads being exposed through at least some of said plurality of openings, said at least some of said plurality of openings being surrounded by said non solder-wettable surface of said potential plane element so as to confine solder flow proximate to said at least some of said plurality of pads.

2. A component as claim ed in claim 1 wherein said plurality of openings in said potential plane element includes a plurality of holes therein, each said pad being disposed within one of said holes, each said hole being larger than the pad disposed in that one of said holes, and there being an annular gap between said pad and said potential plane element surrounding said pad.

3. A component for forming solder connections comprising a dielectric base having a non solder-wettable surface, a plurality of solder-wettable electrically conductive pads exposed to said non solder-wettable surface, and an electrically conductive potential plane element overlying said non solder-wettable surface of said base, said potential plane element having a plurality of openings therein, said at least some of said plurality of pads being exposed through at least some of said plurality of openings, wherein said potential plane element includes a metallic element and a non solder-wettable surface integral with said metallic element.

4. A component as claimed in claim 1 wherein said non solder-wettable surface includes one or more metals selected from the group consisting of nickel, chromium, rhodium, osmium and combinations thereof.

5. A component as claimed in claim 1 wherein said non solder-wettable surface includes one or more metal compounds integral with said metallic layer.

6. A component as claimed in claim 5 wherein said metal compounds include one or more metal oxides.

7. A component as claimed in claim 1 wherein said potential plane element includes a metallic core and a coating on said core defining the non solder-wettable surface of the potential plane.

8. A component as claimed in claim 7 wherein said coating is a polymeric coating.

9. A component as claimed in claim 7 wherein said coating is an electrophoretically applied coating.

10. A component as claimed in claim 1 further comprising solder masses on said pads projecting away from said dielectric base and through said openings of said potential plane element, at least some of said solder masses being electrically isolated from said potential plane element.

11. A component as claimed in claim 10 wherein said potential plane element has a solder-wettable surface adjacent at least one of said pads and at least one of said solder masses is connected to said wettable surface and to a pad adjacent thereto.

* * * * *

UNITED STATES PATENT AND TRADEMARK OFFICE
CERTIFICATE OF CORRECTION

PATENT NO. : 6,329,605 B1  
DATED : December 11, 2001  
INVENTOR(S) : Masud Beroz and Belgacem Haba Page 1 of 1

It is certified that error appears in the above-identified patent and that said Letters Patent is hereby corrected as shown below:

Column 1,
Line 3, insert the heading "BACKGROUND OF THE INVENTION" before the first paragraph.
Line 9, delete the heading "BACKGROUND OF THE INVENTION" after the first paragraph.

Column 3,
Line 59, "strip-mine" should read -- stripline --.
Line 61, "strip-mine" should read -- stripline --.

Column 5,
Line 34, "lelement" should read -- element --.

Column 10,
Line 4, "claim ed" should read -- claimed --.

Signed and Sealed this

Twenty-first Day of May, 2002

*Attest:*

*Attesting Officer*

JAMES E. ROGAN
*Director of the United States Patent and Trademark Office*